United States Patent [19]

Lukes et al.

[11] Patent Number: 5,831,484
[45] Date of Patent: Nov. 3, 1998

[54] DIFFERENTIAL CHARGE PUMP FOR PHASE LOCKED LOOP CIRCUITS

[75] Inventors: Eric John Lukes; James David Strom, both of Rochester, Minn.

[73] Assignee: International Business Machines Corporation, Armonk, N.Y.

[21] Appl. No.: 826,436

[22] Filed: Mar. 18, 1997

[51] Int. Cl.$^6$ ............................................... H03L 7/089
[52] U.S. Cl. ........................... 331/17; 331/8; 331/25; 327/157
[58] Field of Search ..................... 331/1 A, 8, 17, 331/25, 34; 327/156–159, 534–537

[56] References Cited

U.S. PATENT DOCUMENTS

| | | | |
|---|---|---|---|
| 4,636,748 | 1/1987 | Latham, II ................................ | 331/17 |
| 4,885,554 | 12/1989 | Wimmer .................................. | 331/25 |
| 4,959,618 | 9/1990 | Shier ...................................... | 328/155 |
| 4,987,387 | 1/1991 | Kennedy et al. ......................... | 331/1 |
| 5,126,692 | 6/1992 | Shearer et al. ........................... | 331/8 |
| 5,166,641 | 11/1992 | Davis et al. ............................. | 331/1 |
| 5,208,546 | 5/1993 | Nagaraj et al. .......................... | 328/155 |
| 5,285,114 | 2/1994 | Atriss et al. ............................ | 307/264 |
| 5,319,320 | 6/1994 | Abe et al. ............................... | 331/1 |
| 5,363,066 | 11/1994 | Chen et al. .............................. | 331/17 |
| 5,382,922 | 1/1995 | Gersbach et al. ........................ | 331/1 |
| 5,384,502 | 1/1995 | Volk ....................................... | 327/157 |
| 5,422,529 | 6/1995 | Lee ........................................ | 327/536 |
| 5,422,603 | 6/1995 | Soyuer ................................... | 331/1 |
| 5,424,689 | 6/1995 | Gillig et al. ............................ | 331/17 |
| 5,491,439 | 2/1996 | Kelkar et al. ........................... | 327/157 |
| 5,495,207 | 2/1996 | Novof .................................... | 331/57 |
| 5,513,225 | 4/1996 | Kelkar et al. ........................... | 375/376 |
| 5,525,932 | 6/1996 | Kelkar et al. ........................... | 331/1 |
| 5,532,636 | 7/1996 | Mar et al. ............................... | 327/543 |
| 5,546,052 | 8/1996 | Austin et al. ........................... | 331/1 |
| 5,663,689 | 9/1997 | Baumgartner et al. .................. | 331/17 |

OTHER PUBLICATIONS

IBM Technical Disclosure Bulletin R.D. Gilligham, J.F. Mikos, and J.D. Strom; vol. 33, No. 9, Feb. 1991; pp. 332–333 Differential Charge Pump.

IBM Technical Disclosure Bulletin M.B. Ebler, JMA W. Siljenberg and J.T. Trnka; vol. 33, No. 4, Sep. 1990; pp. 252–254 Charge Pump.

*Primary Examiner*—David Mis
*Attorney, Agent, or Firm*—Joan Pennington

[57] ABSTRACT

A differential charge pump is provided for use with phase locked loop (PLL) circuits including a differential loop filter and a common mode bias circuit for maintaining a predetermined bias voltage value on a high voltage filter side of the loop filter. The differential charge pump includes a reference current source. First and second current mirrors are coupled to the reference current source for providing a first mirror current and a second mirror current. A first switching transistor coupled to the first current mirror receives an input UP signal conducts current from a first side of the loop filter. A second switching transistor coupled to the second current mirror receives an input DOWN signal and conducts current from a second side of the loop filter. The first and second current mirror and switching transistors are formed by N-channel metal oxide semiconductor (NMOS) devices. The differential charge pump enables a large differential output voltage with low phase error.

12 Claims, 3 Drawing Sheets

DIFFERENTIAL CHARGE PUMP FOR PHASE LOCKED LOOP CIRCUITS

FIELD OF THE INVENTION

The present invention generally relates phase locked loop (PLL) circuits, and more particularly to, improved differential charge pump circuits for PLL circuits.

DESCRIPTION OF THE PRIOR ART

Phase locked loop (PLL) circuits are widely used in many different applications. A charge pump is an important element in many phase-locked loop designs. The charge pump changes logic signals from the phase frequency detector into current pulses. These current pulses charge or discharge a filter which controls a voltage controlled oscillator (VCO). Many existing charge pump arrangements have an undesirable limited differential output voltage range and exhibit phase error problems.

For example referring to FIG. 2, a prior art charge pump filter arrangement 200 is shown that encounters a problem when a large differential voltage is achieved between the output filter nodes FILTP and FILTN. With a predetermined common mode voltage level, such as 1.2 V or 1.8 V at nodes FILTP and FILTN, and an offset of 0.7 V, the low side of the filter 204 drops down to 0.5 V or 1.1 V. When the UP and/or DN signals are low (UP bar and/or DN bar are high), the source nodes of the switching field effect transistors FETs 208, 214 will pull up to a threshold drop Vt below the supply voltage for typical complementary metal oxide semiconductor (CMOS) phase/frequency detectors. When the UP and/or DN signals switch high the voltage potential at the sources is higher than the drains of the switching FETs 208, 214, the capacitors of the low voltage filter side will discharge a brief current into that side of the filter 204. This produces a phase error in the null state when both UP and DN switch together for a short pulse when both FILTP and FILTN currents should be out of the filter 204.

A need exists for an improved differential charge pump for use with phase locked loop (PLL) circuits. A need exists to minimize phase error over a broad frequency range. A need exists for wide control voltage ranges to mizimize VCO gain (Mhz/V).

SUMMARY OF THE INVENTION

A principal object of the present invention is to provide a differential charge pump for phase locked loop (PLL) circuits that provides efficient and effective performance. Other important objects are to provide such differential charge pump substantially without negative effects and that overcomes many of the disadvantages of prior art arrangements.

In brief, a differential charge pump is provided for use with phase locked loop (PLL) circuits including a differential loop filter and a common mode bias circuit for maintaining a predetermined bias voltage value on a high voltage filter side of the loop filter. The differential charge pump includes a reference current source. First and second current mirrors are coupled to the reference current source for providing a first mirror current and a second mirror current. A first switching transistor coupled to the first current mirror receives an input UP signal conducts current from a first side of the loop filter. A second switching transistor coupled to the second current mirror receives an input DOWN signal and conducts current from a second side of the loop filter.

In accordance with feature of the invention, the first and second current mirror and switching transistors are formed by N-channel metal oxide semiconductor (NMOS) devices. The differential charge pump enables a large differential output voltage with low phase error.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
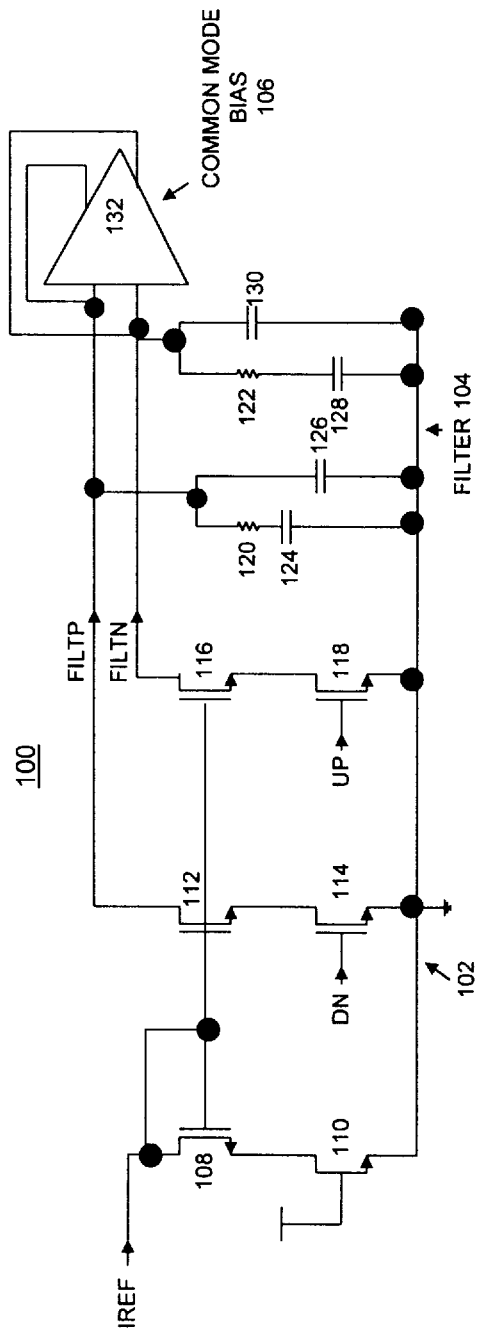
FIG. 1 is a schematic and block diagram representation of a charge pump, and a filter with a common mode bias circuit of the preferred embodiment.

Having reference now to FIG. 1, there is shown a differential charge pump filter with a common mode bias circuit generally designated by the reference character 100 and arranged in accordance with the present invention. The differential charge pump filter with common mode bias circuit 100 includes a charge pump 102 of the preferred embodiment, a differential filter 104, and a common mode bias circuit 106. Conventional arrangements are used to implement the filter 104 and the common mode bias circuit 106.

In accordance with features of the invention, the charge pump 102 is implemented with all N-channel metal oxide semiconductor (NMOS) devices. The charge pump 102 includes a first input DN and a second input UP and differential outputs FILTP, and FILTN coupled to the filter 104. The charge pump 102 enables a large differential output voltage with low phase error. The charge pump 102 includes a plurality of N-channel field effect transistors NFETs 108, 110, 112, 114, 116 and 118. A reference current IREF is applied to the source and gate of NFET 108. A set reference current IREF, such as 25 uA is applied to the charge pump 102, and the NFETs 108, 110, 112, 114, 116 and 118 are scaled so that the reference current is multiplied through the current mirror NFETs 112, 114 or NFETs 116, 118 to provide a predetermined output current, such as 100 uA.

As shown in FIG. 1, current mirroring is provided with NFETs 112 and 116. The drain and gate of NFET 108 is connected to the reference current source IREF and connected to ground by NFET 110. The source of NFET 108 is connected to the drain of NFET 110 with the gate of NFET 110 coupled to a supply voltage and the source connected to ground. The gates of NFETs 108, 112 and 116 are connected together. The first input DN is coupled to a gate of switching NFET 114 and the second input UP is coupled to a gate of switching NFET 118. The sources of NFETs 114 and 118 are connected to ground. The drain of switching NFET 114 is coupled to the source of current mirroring NFET 112 with the drain of NFET 112 connected to the FILTP node. The drain of switching NFET 118 is coupled to the source of current mirroring NFET 116 with the drain of NFET 116 connected to the FILTN node.

The conventional differential loop filter 104 includes a respective resistor 120, 122 connected to the FILTN and FILTP nodes and connected to respective capacitors 124, 126, and 128, 130. Capacitors 126 and 130 are connected between the FILTN and FILTP nodes and ground and capacitors 124 and 128 are connected to the other end of resistors 120, 122 and ground and capacitors.

The conventional common mode circuit 106 adjusts the highest voltage filter node FILTP or FILTN to a predetermined voltage, such as 1.2 V or 1.8 V with a low voltage supply, such as a 2.5 V supply voltage and functions to hold the common-mode voltage at the filter nodes constant. For example, the conventional common mode bias circuit 106 can be arranged as illustrated and described with respect to common mode bias circuit 306 in FIG. 3.

A relatively large differential voltage for example, of at least 0.7 V or larger, is enabled with the high voltage filter side FILTP filter node set to the predetermined voltage of 1.8 V and the low voltage filter side FILTP filter node can drop down to 1.1 V. At zero offset, both FILTP and FILTN will be biased to the predetermined bias voltage, such 1.8 V.

Figure 2:
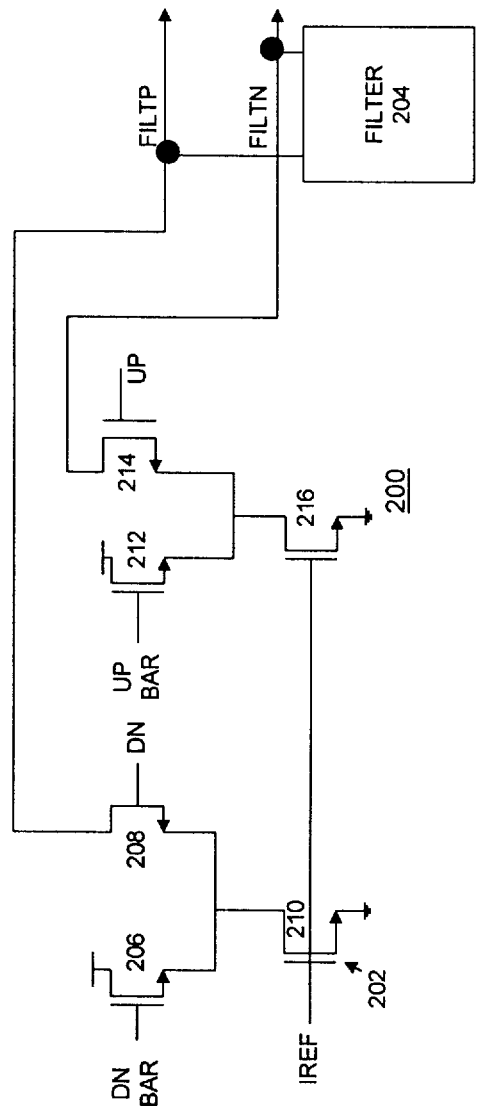
FIG. 2 is a schematic diagram representation of a prior art charge pump filter circuit.

In accordance with features of the invention, with the charge pump 102, the phase error problem of the prior art arrangement of FIG. 2 is eliminated because the drain nodes of the switching transistors NFETs 114, 118 never rise above their corresponding filter voltages FILTP, FILTN. With the current mirror transistors NFETs 112, 116 between the switching transistors NFETs 114, 118 and the filter 104, much of the switching noise is negated by the parasitic capacitances.

In operation, when an UP signal is received NFET 118 is turned on and the charge pump 102 pulls charge from the FILTN node of filter 104, increasing a positive differential voltage or decreasing a negative differential voltage. When a DN signal is received NFET 114 is turned on and the charge pump 102 pulls charge current to the FILTP node of filter 104, decreasing a positive differential voltage or increasing a negative differential voltage. During the time that the charge pump 102 is decreasing voltage across one side of the filter 104, the common mode circuit 106 works to maintain the high voltage side of the filter at the predetermined voltage, such as 1.2 V or 1.8 V.

If the FILTP node is the high voltage filter side with a positive differential voltage, and the charge pump 102 is pulling current from the FILTN side, the common mode bias circuit 106 does not adjust the bias voltage. If the FILTP node is the high voltage filter side and the charge pump 102 is pulling current from the FILTP node, the common mode bias circuit 106 will pump current up to a set current value, such as 20 uA into the FILTP and FILTN nodes of the filter 104 until the capacitors 124, 126, 128, 130 charge up and the high side is back to the predetermined voltage, such as 1.2 V or 1.8 V. The common mode bias circuit 106 applies equal currents into the FILTP and FILTN nodes of the filter 104 so that the common mode voltage is increased, while the differential voltage remains unchanged. Similarly when the FILTN side is the high voltage side with a negative differential voltage, and the charge pump 102 is pulling current from the FILTP side, the common mode bias circuit 106 does not adjust the bias voltage. If FILTN filter node is the high voltage filter side and the charge pump 102 is pulling current from the FILTN filter node, the common mode bias circuit 104 will pump current up to 20 uA into the filter 104 until the capacitors 124, 126, 128, 130 charge up and the high side is back to the predetermined voltage, such as 1.2 V.

Figure 3:
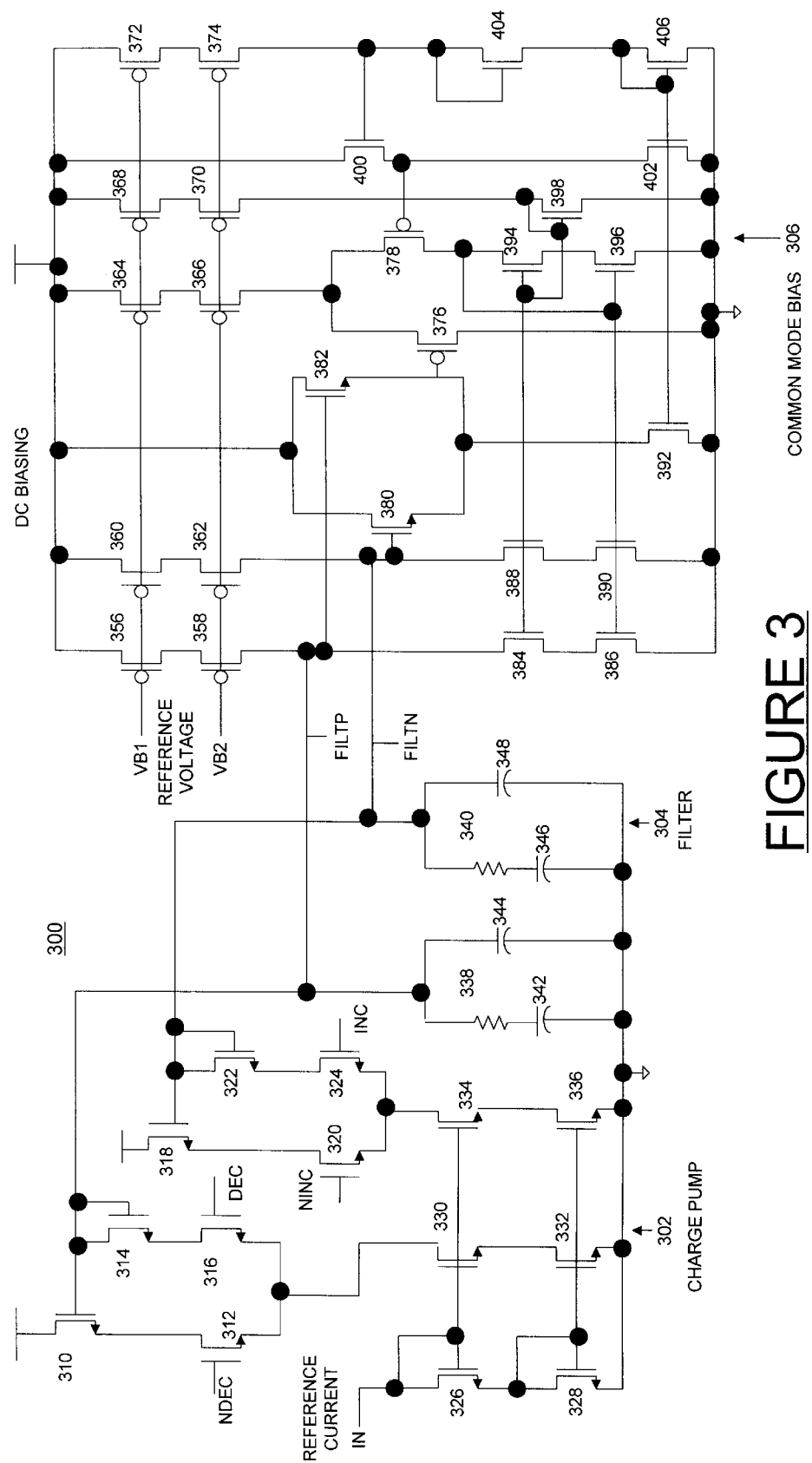
FIG. 3 is a schematic diagram representation of an alternative charge pump, and a filter with a common mode bias circuit of the present invention.

Referring to FIG. 3, a schematic of an alternative differential charge pump filter with a common mode bias circuit 300 including an alternative charge pump 302, a conventional differential loop filter 304, and a conventional common mode bias circuit 306 is shown. In the alternative charge pump 302 a current reference current IREF, such as 25 uA is applied to the charge pump 302. Charge pump 302 is implemented with all N-channel metal oxide semiconductor (NMOS) devices. The charge pump 302 includes a first inputs DEC and complement NDEC and a second inputs INC and complement NINC and differential outputs FILTP, and FILTN coupled to the filter 304. The charge pump 302 includes a plurality of N-channel field effect transistors NFETs 310, 312, 314, 316, 318, 320, 322, 324 and current mirroring transistors NFETs 326, 328, 330, 332, 334, and 336. The current mirroring transistors NFETs 326, 328, 330, 332, 334, and 336 in the charge pump 302 are scaled so that this current is multiplied, through a cascoded current mirror, to a predetermined output current, such as the example value of 100 uA. Charge pump 302 provides improved voltage supply noise rejection coefficient as compared with the preferred charge pump 102. In charge pump 302, the current mirroring transistors NFETs 326, 328, 330, 332, 334, and 336 are always turned on. A current path is provided for current mirroring transistors NFETs 330, 332 from either NFETs 310, 312 or NFETs 314, 316. A current path is provided for current mirroring transistors NFETs 334, 336 from either NFETs 318, 320 or NFETs 322, 324.

Filter 304 is an identical arrangement to filter 104 including a pair of resistor 338, 340 connected to the FILTN and FILTP nodes and capacitors 342, 344, 346, and 348. The common mode bias circuit 306 is a conventional arrangement including multiple PFETs 356, 358, 360, 362, 364, 368, 370, 372, 374, 376, 378 and multiple NFETs 380, 382, 384, 386, 388, 390, 392, 394, 394, 396, 398, 400, 402, 404, and 406. As described with respect to the common mode bias circuit 106, the common mode bias circuit 306 adjusts the highest voltage filter node FILTP or FILTN to a predetermined voltage, such as 1.8 V and functions to hold the common-mode voltage at the filter nodes constant. At zero offset, both FLITP and FILTN will be biased to the predetermined voltage, for example, 1.8 V. In common mode bias circuit 306, the voltage at the respective filter nodes FILTP and FILTN is applied to the gates of source-coupled differential transistor pairs NFETs 380 and 382 with the drains of each connected to a supply voltage. NFET 392 connects the NFETs 380 and 382 to ground. Reference voltages VB1, VB2 are applied to respective gates of NFETs 356, 360, 364, 368, 372, and NFETs 358, 562, 366, 370, 374. NFETs 384, 386 and NFETs 388, 390 respectively connect PFETs 256, 358 and PFETs 360, 362 to ground. PFET 376 connect PFETs 364, 366 to ground and the gate of PFET 376 is connected to the sources of NFETs 380 and 382. NFETs 394, 396 connect PFETs 364, 366 to ground. NFETs 394, 396, 398, 404, 406 act as current mirrors. NFETs 404 and 406 connect PFETs 372, 374 to ground.

In charge pump 302, NFETs 310, 312 and NFETs 318, 320 are connected between a supply voltage and ground by respective current mirror NFETs 330, 332 and NFETs 334, 336. NFETs 314, 316 are connected between the filter node FILTP and ground by the current mirror NFETs 330, 332. NFETs 322, 324 are connected between the filter node FILTN and ground by the current mirror NFETs 334, 336. A down or DEC signal is applied to the gate of NFET 316 to turn on NFETs 316 and 314 causing current to flow from the FILTP filter node. The complementary NDEC signal applied to the gate of NFET 312 turns off NFETs 312 and 310. An up or INC signal is applied to the gate of NFET 324 to turn on NFETs 324 and 322 causing current to flow from the FILTN filter node. The complementary NINC signal applied to the gate of NFET 320 turns off NFETs 320 and 318.

The reference current IREF, such as 25 uA is applied to the drain and gate of NFET 326. The source of NFET 326 is connected to the drain and gate of NFET 328 and the source of NFET 328 is connected to ground. The gates of respective NFETs 326, 330, 334 and NFETs 328, 332, 336 are connected together. The source of respective NFETs 330, 334 is connected to the drain of respective NFETs 332, 336. The sources of NFETs 332 and 336 are connected to ground.

In operation, when an INC signal is received, the charge pump 302 pulls charge from the FILTN filter increasing a positive differential voltage or decreasing a negative differential voltage. The opposite happens when a DEC signal is received. During the time that the charge pump 302 is decreasing voltage across one side of the filter, the common mode circuit 306 works to maintain the high voltage side of the filter at 1.8 V.

If the FILTP filter node is the high side, thus a positive differential voltage, and the charge pump 302 is pulling current from the FILTN side, the common mode circuit 306 does not adjust. If the FILTP filter node is the high side and the charge pump is pulling current from the FILTP filter node, the common mode circuit 306 will pump current up to predefined current value, such as 20 uA into the filter 304 until the capacitors 342, 344, 346, 348 charge up and the high side is back to 1.8 V. The same happens for the FILTN side when it is the high voltage side with a negative differential voltage.

While the present invention has been described with reference to the details of the embodiments of the invention shown in the drawing, these details are not intended to limit the scope of the invention as claimed in the appended claims.

What is claimed is:

1. A differential charge pump for use with phase locked loop (PLL) circuits including a differential loop filter and a common mode bias circuit for maintaining a predetermined bias voltage value on a high voltage filter side of the loop filter, said differential charge pump comprising:

means for providing a reference current source;

first and second current mirror means coupled to said reference current means for providing a first mirror current and a second mirror current;

first transistor switching means coupled to said first current mirror means for receiving an input UP signal and for conducting current from a first side of the loop filter; and second transistor switching means coupled to said second current mirror means for receiving an input DOWN signal and for conducting current from a second side of the loop filter.

2. A differential charge pump as recited in claim 1 wherein said first and second current mirror means and said first and second transistor switching means include a plurality of N-channel metal oxide semiconductor (MOS) devices.

3. A differential charge pump as recited in claim 2 wherein said plurality of N-channel metal oxide semiconductor (MOS) devices include field effect transistors (FETs).

4. A differential charge pump as recited in claim 1 wherein said first and second current mirror means include current mirror field effect transistors (FETs) coupled between said first and second transistor switching means and the differential loop filter.

5. A differential charge pump as recited in claim 1 wherein said first and second current mirror means include current mirror field effect transistors (FETs) sized to provide an output current being equal to a multiplied value of said reference current.

6. A differential charge pump as recited in claim 1 wherein said means for providing a reference current include a first reference current field effect transistor having a drain and gate connected to a reference current source and a source coupled to ground and wherein said first and second current mirror means include a pair of field effect transistors (FETs), the gates of which are connected to said first reference current field effect transistor.

7. A differential charge pump as recited in claim 6 wherein each of said field effect transistors (FETS) are N-channel metal oxide semiconductor (MOS) devices.

8. A differential charge pump as recited in claim 1 wherein said first and second current mirror means include a pair of N-channel metal oxide semiconductor (MOS) current mirroring devices, a drain of each is coupled to a respective filter node of the differential loop filter.

9. A differential charge pump as recited in claim 8 wherein said first and second transistor switching means include a pair of N-channel metal oxide semiconductor (MOS) devices, a drain of each is coupled to a respective source of said pair of N-channel metal oxide semiconductor (MOS) current mirroring devices.

10. A differential charge pump as recited in claim 1 wherein each of said first and second transistor switching means include a pair of field effect transistors (FETs), the sources of which are connected together and one of said input UP or DOWN signals is applied to a gate of one of said FETs and a complementary UP or DOWN input signal is applied to the gate of the other one of the FETs.

11. A differential charge pump as recited in claim 10 wherein said one of said FETs the gate of which receives one of said input UP or DOWN signals, the gate of which is connected to a respective filter node of the differential loop filter.

12. A differential charge pump as recited in claim 10 wherein each said pair of field effect transistors (FETs) includes sources connected together, and wherein a respective one of said first and second current mirror means is connected between said sources and ground.

\* \* \* \* \*